(12) United States Patent
Takahashi

(10) Patent No.: US 7,253,419 B2
(45) Date of Patent: Aug. 7, 2007

(54) APERTURED PLATE SUPPORT MECHANISM AND CHARGED-PARTICLE BEAM INSTRUMENT EQUIPPED THEREWITH

(75) Inventor: Makoto Takahashi, Tokyo (JP)

(73) Assignee: Jeol Ltd., Tokyo (JP)

( * ) Notice: Subject to any disclaimer, the term of this patent is extended or adjusted under 35 U.S.C. 154(b) by 331 days.

(21) Appl. No.: 11/105,193

(22) Filed: Apr. 13, 2005

(65) Prior Publication Data

US 2005/0242295 A1 Nov. 3, 2005

(30) Foreign Application Priority Data

Apr. 13, 2004 (JP) ............... 2004-117524

(51) Int. Cl.
*G01N 23/00* (2006.01)
*G21K 5/10* (2006.01)

(52) U.S. Cl. ............ 250/442.11; 250/310; 250/311; 250/440.11; 250/492.22

(58) Field of Classification Search ............ 250/311, 250/442.11, 310, 492.2, 492.22, 441.11
See application file for complete search history.

(56) References Cited

U.S. PATENT DOCUMENTS 3,909,611 A * 9/1975 von Rauch ............ 250/306

6,669,121 B2 * 12/2003 Kasai ............ 250/442.11
2003/0047689 A1 * 3/2003 Kasai ............ 250/442.11
2003/0098963 A1 * 5/2003 Phillips et al. ............ 355/73

FOREIGN PATENT DOCUMENTS

JP 10-284391 10/1998

* cited by examiner

*Primary Examiner*—Robert Kim
*Assistant Examiner*—Johnnie L Smith, II
(74) *Attorney, Agent, or Firm*—The Webb Law Firm

(57) ABSTRACT

An apertured plate support mechanism used in an electron beam lithography machine. The apertured plate is held to a plate holder. The plate support mechanism has the plate holder for holding the apertured plate and a holder support for supporting the plate holder. The apertured plate is provided with an aperture through which a beam of charged particles passes. Grooves extending radially in plural directions about the center axis of the aperture are formed in the supported surface of the plate holder or the supporting surface of the holder support. Convex portions engaged in the grooves are formed on the other of the supported or supporting surfaces.

10 Claims, 3 Drawing Sheets

APERTURED PLATE SUPPORT MECHANISM AND CHARGED-PARTICLE BEAM INSTRUMENT EQUIPPED THEREWITH

BACKGROUND OF THE INVENTION

1. Field of the Invention

The present invention relates to an apertured plate support mechanism used in a charged-particle beam instrument, such as an electron-beam lithography machine, and also to a charged-particle beam instrument equipped with the support mechanism.

2. Description of Related Art

A variable-area electron beam lithographic machine is known as a charged-particle beam instrument for writing a desired pattern on a substrate, such as a semiconductor wafer or mask substrate (reticle), by irradiating the substrate with a charged-particle beam.

In such an electron-beam lithography machine, an electron beam is emitted and accelerated from an electron beam source consisting of an electron gun. The beam is passed through an aperture formed in an apertured plate so that the cross section of the beam is shaped. The beam shaped in this way is made to hit a specified position to be written on the substrate for a desired time under control of an illumination system having an objective lens and a deflector. Lithographic delineation on the substrate using the electron beam is carried out by repeating the irradiation by the shaped beam with different specified positions.

Usually, there are fitted two apertured plates, each having an aperture for shaping the cross section of an electron beam. A deflector is disposed between the two apertured plates. The shaped beam passed through the aperture in the first plate is made to hit the second plate having the aperture that is offset from the aperture in the first plate. In consequence, the cross section of the beam passed through the aperture in the second stage is shaped into a desired form.

FIG. 1 schematically shows a mechanism for supporting such an apertured plate. In this figure, the support mechanism is generally indicated by numeral 51. This mechanism 51 has a plate holder 51*a* for holding the apertured plate and a holder support 51*b* for supporting the holder 51*a*.

The plate holder 51*a* has a holder body 59 and a cap portion 60. The apertured plate is held to the plate holder 51*a* while sandwiched between the holder body 59 and cap portion 60. A protruding portion 61 for engagement is fixed to the holder body 59. When the apertured plate held to the plate holder 51*a* is replaced, a holder pullout (not shown) is brought into engagement with the protruding portion 61 of the plate holder 51*a* to move the plate holder 51*a*.

The holder support 51*b* has a rectangular upper plate 52, a U-shaped pedestal 58, and a connector portion 57 for connecting the upper plate 52 and pedestal 58. The plate holder 51*a* is accommodated in the space between the upper plate 52 and pedestal 58 and supported on the upper surface (supporting surface) 58*a* of the pedestal 58. At this time, the lower supported surface 59*c* of the peripheral portion of the holder body 59 of the plate holder 51*a* is in contact with the upper surface 58*a* of the pedestal 58.

A recess 59*b* is formed in the side surface of the holder body 59 of the plate holder 51*a*. A positioning pin 56 mounted between the upper plate 52 and pedestal 58 is fitted in the recess 59*b*, thus placing the plate holder 51*a* in position.

A U-shaped leaf spring 54 is mounted to the lower surface 52*b* of the upper plate 52 of the holder support 51*b* via a holding portion 53. A roller 55 is mounted at the front end 54*a* of the leaf spring 54. The bottom of the roller 55 is in contact with the upper surface 59*d* of the holder body 59 in the plate holder 51*a*. Resilient force of the leaf spring 54 holds the plate holder 51*a* against the pedestal 58, the spring 54 being mounted to the upper plate 52.

An aperture 52*a* is formed in the upper plate 52 of the holder support 51*b*. Also, apertures 59*a* and 60*a* are formed in the holder body 59 and cap portion 60, respectively, in the plate holder 51*a*. The apertures 52*a*, 59*a*, and 60*a* are so positioned that their centers are coaxial. An electron beam 100 emitted from an electron beam source (not shown) passes through the apertures 52*a*, 59*a*, and 60*a*.

The apertured plate is held between the holder body 59 and cap portion 60 in the plate holder 51*a*. The center of the aperture in the plate is made coaxial with the centers of the apertures 52*a*, 59*a*, and 60*a*. When the beam 100 passes through the apertures 59*a* and 60*a* formed in the holder body 59 of the plate holder 51*a* and cap portion 60, the cross-sectional shape of the beam 100 is shaped.

FIG. 2 is a plan view showing main portions of the support mechanism 51 for supporting an apertured plate 62 which is provided with an aperture 62*a*. The apertured plate 62 is disposed under the holder body 59. The apertured plate 62 is held between the holder body 59 and cap portion 60 and fixed, to the holder body 59. As described previously, the center of the aperture 62*a* formed in the apertured plate 62 and the center of the aperture 59*a* formed in the holder body 59 are coaxial.

The position of the plate holder 51*a* within a plane is determined by contact of two contact surfaces 58*b*, 58*c* of the pedestal 58 with the side surface 60*b* of the cap portion 60 forming the plate holder 51*a*.

In another known structure, such an apertured plate is supported by support pins. Thus, the apertured plate is supported to an apertured plate support mechanism (see Japanese Patent Laid-Open No. 10-284391, for example).

In the plate support mechanism 51 constructed as shown in FIGS. 1 and 2, the electron beam 100 may hit the plate holder 51*a*. This thermally expands the cap portion 60 forming the plate holder 51*a*.

When the cap portion 60 forming the plate holder 51*a* thermally expands in this way, the apertured plate 62 moves away from the contact surfaces 58*b* and 58*c* of the pedestal 58. As a result, the aperture 62*a* formed in the apertured plate 62 moves away from the contact surfaces 58*b* and 58*c*.

If the aperture 62*a* formed in the apertured plate 62 moves unnecessarily in this way, shaping of the cross section of the electron beam 100 passing through the aperture 62*a* is affected. Furthermore, the amount of current supplied from the electron beam 100 to the substrate and the writing position are varied.

In the technique described in the above-cited Japanese Patent Laid-Open No. 10-284391, four support pins are disposed rotationally symmetrically with respect to the center of the apertured plate. The support pins act to support the apertured plate, each with a point contact with the plate. It is said that if the apertured plate holder thermally expands, the resultant displacement of the plate holder can be absorbed by slippage of the point contact portions.

It is considered that in this structure, too, movement of the apertured plate and the aperture formed in it due to thermal expansion of the plate holder can be prevented to some extent. Since displacement of the plate holder is absorbed by slippage of the point contact portions, it is difficult to control the slippage reliably. It is difficult to certainly prevent movement of the apertured plate and aperture. In addition, it is difficult to restrict rotation of the apertured plate within a plane.

SUMMARY OF THE INVENTION

It is an object of the present invention to provide an apertured plate support mechanism capable of certainly preventing positional displacement of an apertured plate held to a plate holder and of an aperture formed in the plate. It is another object of the present invention to provide a charged-particle beam instrument equipped with such an apertured plate support mechanism.

An apertured plate support mechanism according to the present invention has: a plate holder for holding an apertured plate provided with an aperture through which a charged-particle beam passes; and a holder support for supporting the plate holder. Grooves extending radially in plural directions about the center axis of the aperture are formed in the supported surface of the plate holder or the supporting surface of the holder support. Convex portions engaged in the grooves are formed on the other of the supported surface or supporting surface.

A charged-particle beam instrument according to the present invention comprises: a source of charged particles for emitting a beam of charged particles; an apertured plate provided with an aperture through which the beam passes; a plate support mechanism for supporting the apertured plate; and an illumination system for directing the beam passed through the aperture at a substrate. The plate support mechanism has a plate holder for holding the apertured plate and a holder support for supporting the plate holder. Grooves extending radially in plural directions about the center axis of the aperture are formed in the supported surface of the plate holder or the supporting surface of the holder support. Convex portions engaged in the grooves are formed on the other of the supported surface or supporting surface.

In the present invention, the apertured plate support mechanism has the plate holder for holding the apertured plate and the holder support for supporting the plate holder. The grooves extending radially in the plural directions about the center axis of the aperture formed in the apertured plate are formed in the supported surface of the plate holder or the supporting surface of the holder support. The convex portions engaged in the grooves are formed on the other of the supported surface or supporting surface.

Therefore, if the plate holder thermally expands when irradiated with the beam of charged particles, the plate holder thermally expands about the center axis of the aperture formed in the apertured plate. This prevents positional displacement of the apertured plate and of the aperture formed in it. Furthermore, the grooves and convex portions are in engagement with each other. Consequently, it is assured that rotation of the apertured plate and the aperture formed in it within a plane is restricted.

Other objects and features of the present invention will appear in the course of the description thereof, which follows.

DESCRIPTION OF THE PREFERRED EMBODIMENTS

Figure 1:
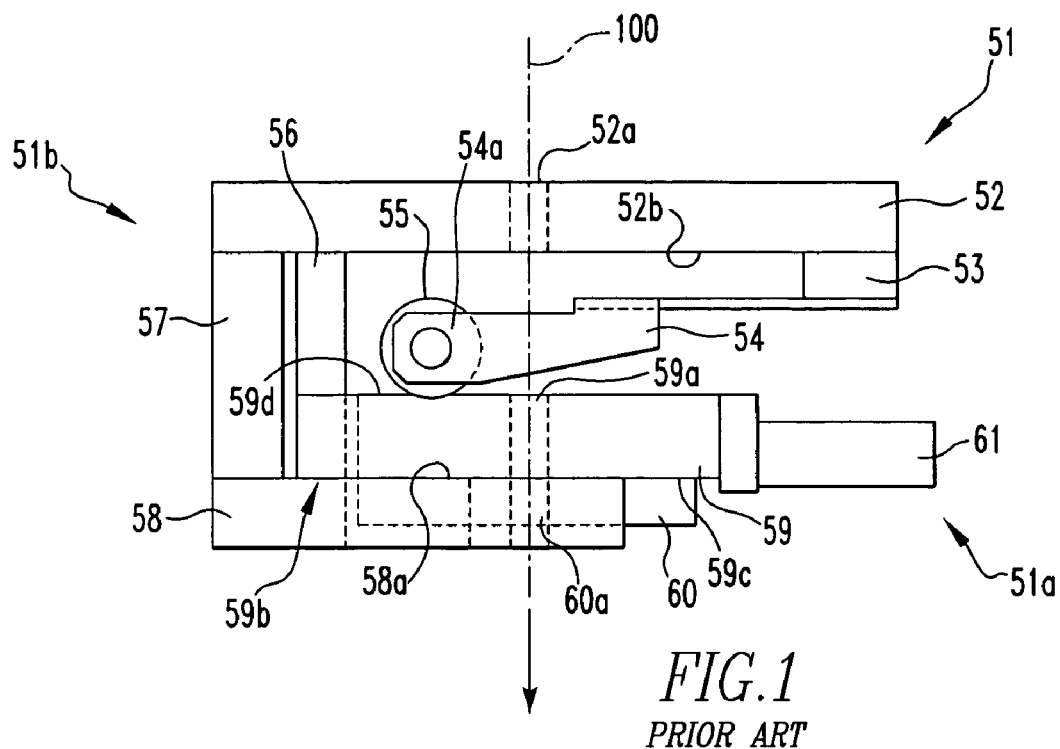
FIG. 1 is a schematic view showing an apertured plate support mechanism of the prior art.
Figure 2:
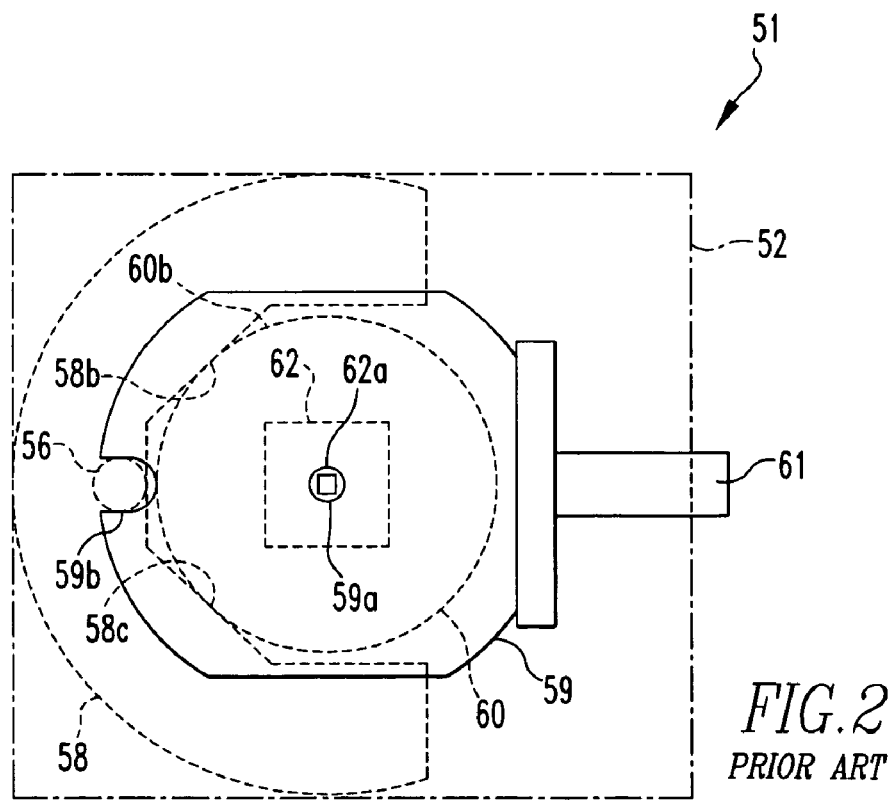
FIG. 2 is a plan view showing main portions of the apertured plate support mechanism of the prior art.
Figure 3:
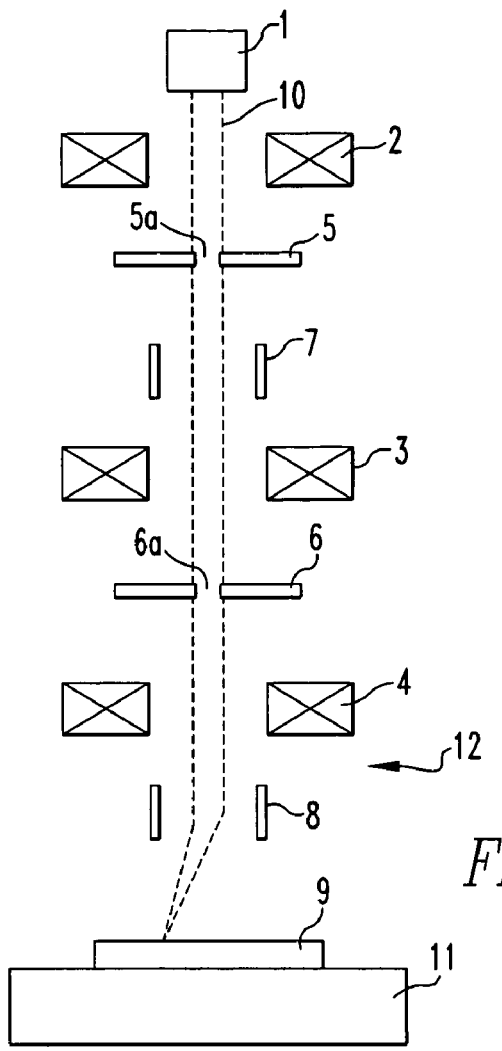
FIG. 3 is a schematic diagram of a charged-particle beam instrument according to the present invention.

The preferred embodiments of the present invention are hereinafter described with reference to the accompanying drawings. FIG. 3 schematically shows a charged-particle beam instrument according to the present invention. This instrument has the structure of an electron beam lithographic machine.

In FIG. 3, the instrument has a source of an electron beam 1 (source of a beam of charged particles) consisting of an electron gun. An electron beam (beam of charged particles) 10 is emitted and accelerated from the beam source 1. The beam 10 is focused by a first condenser lens 2 and passes through an aperture 5a formed in a first apertured plate 5. In this way, the cross section of the beam 10 is shaped in the first stage.

The electron beam 10 passed through the aperture 5a in the first apertured plate 5 is deflected by a first deflector 7 and then focused by a second condenser lens 3. Then, the beam 10 passes through an aperture 6a formed in a second apertured plate 6. In this way, the cross section of the beam 10 is shaped in the second stage.

The electron beam 10 passed through the aperture 6a in the second apertured plate 6 is focused onto a substrate 9 by the objective lens 4. At this time, the beam 10 passed through the objective lens 4 is deflected appropriately by a second deflector 8. The beam is scanned over the substrate 9. Lithographic delineation is carried out on the substrate 9 by the beam 10 scanned over the substrate 9 in this way.

The objective lens 4 and second deflector 8 constitute an illumination system 12 behind the second apertured plate 6. The beam 10 is directed at the substrate 9 under control of the illumination system 12. The substrate 9 is placed on a substrate stage 11.

The first apertured plate 5 and second apertured plate 6 are supported by a plate support mechanism (not shown). This support mechanism is described below by referring to FIG. 4, which is a schematic view showing the plate support mechanism of the present invention. As an example, the support mechanism supports the first apertured plate 5.

Figure 4:
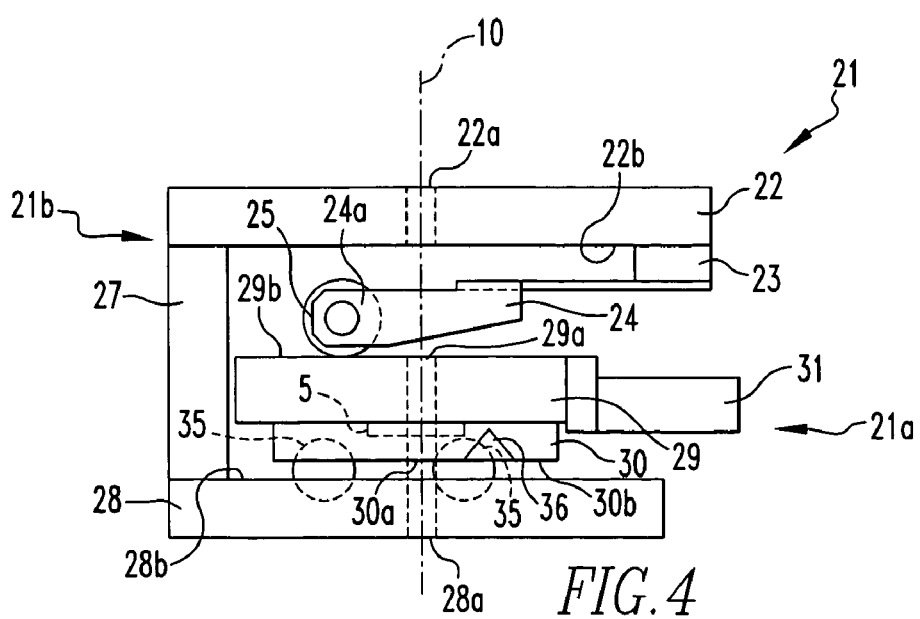
FIG. 4 is a schematic view of an apertured plate support mechanism according to the present invention.

Referring still to FIG. 4, a mechanism 21 for supporting the apertured plate has a plate holder 21a and a holder support 21b for supporting the plate holder 21a. The plate holder 21a holds the apertured plate 5 provided with an aperture 5a (FIG. 3).

The plate holder 21a has a holder body 29 and a cap portion 30. The apertured plate 5 provided with the aperture 5a is sandwiched between the holder body 29 and cap portion 30 and held to the plate holder 21a. A protruding portion 31 for engagement is fixed to the holder body 29. When the apertured plate 5 held to the plate holder 21a is replaced, a holder pullout means (not shown) is brought into engagement with the engaging protruding portion 31 of the plate holder 21a, and the plate holder 21a is moved.

The holder support 21b has a rectangular upper plate 22, a disk-like pedestal 28, and a connector portion 27 for connecting the upper plate 22 and pedestal 28. The plate holder 21a is accommodated in the space between the upper plate 22 and pedestal 28 and supported on the upper surface (supporting surface) 28b of the pedestal 28. The support structure is described in detail later.

An aperture 22a is formed in the upper plate 22 of the holder support 21b. Also, apertures 29a and 30a are formed in the holder body 29 and cap portion 30, respectively, in the plate holder 21a. The apertures 22a, 29a, and 30a are so positioned that their centers are coaxial. An electron beam 10 emitted from an electron beam source 1 (FIG. 3) passes through the apertures 22a, 29a, and 30a.

The apertured plate 5 is held between the holder body 29 and cap portion 30 in the plate holder 21a. The center of the aperture 5a in the apertured plate 5 is made coaxial with the centers of the apertures 22a, 29a, and 30a. When the beam 10 passes through the apertures 29a and 30a formed in the holder body 29 of the holder 21a and cap portion 30, respectively, the cross-sectional shape of the beam 10 is shaped.

As described previously, the plate holder 21a is supported on the upper surface (supporting surface) 28b of the pedestal 28. In particular, grooves 36 of V-shaped cross section are formed in the lower surface (supported surface) 30b of the cap portion 30 forming the plate holder 21a. Convex portions 35 are formed on the upper surface 28b of the pedestal 28. Each convex portion 35 is made of a spherical member. The convex portions 35 are engaged in the grooves 36 formed in the lower surface 30b of the cap portion 30.

Figure 5:
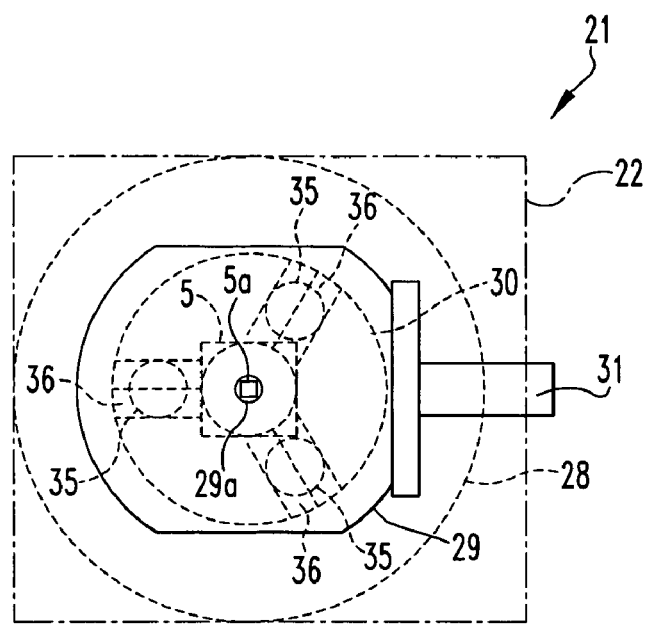
FIG. 5 is a schematic view showing main portions of an apertured plate support mechanism according to the present invention.

FIG. 5 is a plan view showing main portions of the mechanism 21 for supporting an apertured plate 5 that is provided with an aperture 5a. The plate 5 is disposed under the holder body 29. The apertured plate 5 is held between the holder body 29 and cap portion 30 and fixed to the holder body 29. As described previously, the center of the aperture 5a formed in the apertured plate 5 and the center of the aperture 29a formed in the holder body are arranged coaxially.

Figure 6:
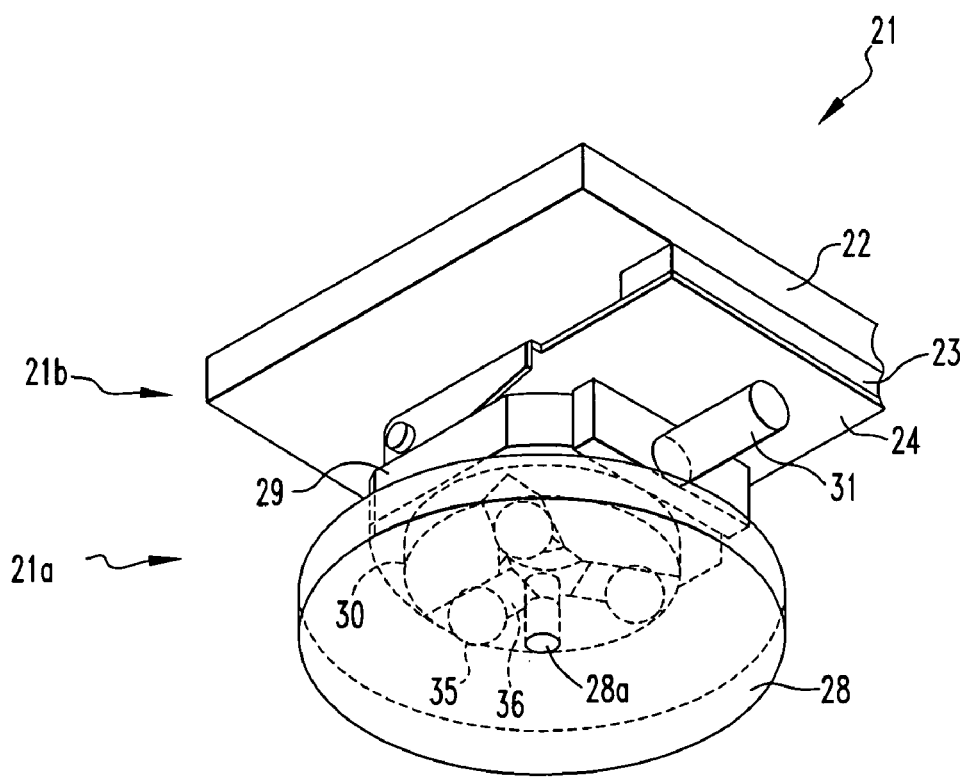
FIG. 6 is a perspective view showing main portions of an apertured plate support mechanism according to the present invention.

The grooves 36 formed in the lower surface 30b of the cap portion 30 forming the plate holder 21a extend radially in three directions about the center axis of the aperture 5a in the apertured plate 5. The aforementioned convex portions 35 are three in number and formed on the upper surface 28b of the pedestal 28. The convex portions 35 are engaged in the three grooves 36 extending in the three directions. As a reference, main portions of the plate support mechanism 21 of the present invention as viewed obliquely from below are shown in the perspective view of FIG. 6.

In this way, in the present invention, the mechanism 21 for supporting the apertured plate has the plate holder 21a for holding the apertured plate 5 and the holder support means 21b for supporting the plate holder 21a. The grooves 36 extending radially in the plural directions about the center axis of the aperture 5a formed in the apertured plate 5 are formed in the supported surface 30b (lower surface of the cap portion 30) of the plate holder 21a. The convex portions 35 engaged in the grooves 36 are formed on the supporting surface 28b (upper surface of the pedestal 28) of the holder support means 21b.

Therefore, if the plate holder 21a thermally expands when irradiated with the electron beam 10, the thermal expansion of the holder 21a occurs about the center axis of the aperture 5a formed in the apertured plate 5. This can certainly prevent positional deviations of the apertured plate 5 and of the aperture 5a formed in it. That is, if the plate holder 21a thermally expands due to irradiation by the beam 10, the positions of the contact portions of the grooves 36 formed in the plate holder 21a which make contact with the convex portions 35 formed on the holder support 21b are displaced along the radially formed grooves 36. Therefore, the position of the center of the aperture 5a in the apertured plate 5 held to the plate holder 21a does not vary. Furthermore, the grooves 36 and convex portions 35 are in engagement with each other. Consequently, rotation of the apertured plate 5 and the aperture 5a formed in it within a plane is restricted.

In the above-described embodiment, the grooves 36 extending radially in three directions about the center axis of the aperture 5a in the apertured plate 5 are formed in the lower surface 30b of the cap portion 30 forming the plate holder 21a. The present invention is not limited to this structure. The number of the grooves 36 extending radially about the center axis of the aperture 5a may be more than three (i.e., in more than three directions). In this case, the convex portions 35 formed on the upper surface 28b of the pedestal 28 are equal in number with the grooves 36. Also, the convex portions 35 are disposed in a corresponding manner to the grooves 36. It is to be noted, however, where the number of the grooves 36 is set to three (i.e., extend in three directions) as in the above embodiment, the engagement is made with good stability when the cap portion 30 of the plate holder 21a is supported on the pedestal 28 of the holder support means 21b. In the embodiment described above, the present invention is embodied as the mechanism for supporting the first apertured plate 5. The present invention can also be applied to a mechanism for supporting the second apertured plate 6 (see FIG. 3).

Furthermore, it is not necessary that the shape of the cross section of each groove 36 be limited to a V shape. It may also be a U shape, for example. However, where they are V-shaped grooves, engagement with the convex portions 35 made of spherical members provide better stability.

In addition, the grooves 36 may be formed in the upper surface 28b of the pedestal 28 forming the holder support means 21b, and the convex portions 35 engaged in the grooves 36 may be formed on the lower surface 30b of the cap portion 30 forming the plate holder 21a.

Having thus described my invention with the detail and particularity required by the Patent Laws, what is desired protected by Letters Patent is set forth in the following claims.

The invention claimed is:

1. A mechanism for supporting an apertured plate, comprising:
   a plate holder for holding the apertured plate provided with an aperture through which a beam of charged particle passes;
   a holder support for supporting the plate holder;
   grooves extending radially in plural directions about the center axis of said aperture and formed in a supported surface of the plate holder or a supporting surface of the holder support; and
   convex portions engaged in the grooves and formed on the other of the supported surface or the supporting surface.

2. A mechanism for supporting an apertured plate as set forth in claim 1, wherein said grooves extend in three directions about the center axis of said aperture.

3. A mechanism for supporting an apertured plate as set forth in claim 1, wherein each of said grooves has a V-shaped cross section.

4. A mechanism for supporting an apertured plate as set forth in claim 1, wherein each of said convex portions is made of a spherical member.

5. A mechanism for supporting an apertured plate as set forth in claim 1, wherein said grooves are formed in the supported surface of the plate holder, while said convex portions are formed on the supporting surface of the holder support.

6. A charged-particle beam instrument having a charged-particle beam source for emitting a beam of charged particles, an apertured plate provided with an aperture through which the beam passes, a plate support mechanism for supporting the apertured plate, and an illumination system for directing the beam passed through the aperture at a substrate, wherein said plate support mechanism has a plate holder for holding the apertured plate and a holder support for supporting the plate holder, wherein grooves extending radially in plural directions about the center axis of said aperture are formed in a supported surface of the plate holder or a supporting surface of the holder support, and wherein convex portions engaged in the grooves are formed on the other of the supported surface or the supporting surface.

7. A charged-particle beam instrument as set forth in claim 6, wherein said grooves in said plate support mechanism extend in three directions about the center axis of said aperture.

8. A charged-particle beam instrument as set forth in claim 6, wherein each of said grooves in said plate support mechanism has a V-shaped cross section.

9. A charged-particle beam instrument as set forth in claim 6, wherein each of said convex portions of said plate support mechanism is made of a spherical member.

10. A charged-particle beam instrument as set forth in claim 6, wherein said grooves in said plate support mechanism are formed in the supported surface of the plate holder, while said convex portions of said plate support mechanism are formed on the supporting surface of the holder support.

* * * * *